(12) United States Patent
Tang

(10) Patent No.: US 12,394,689 B2
(45) Date of Patent: Aug. 19, 2025

(54) THERMAL THICK FILM INTEGRATED CIRCUIT

(71) Applicant: Sidney Tang, Hong Kong (CN)

(72) Inventor: Sidney Tang, Hong Kong (CN)

(73) Assignee: Sidney Tang, Wanchai (HK)

( * ) Notice: Subject to any disclaimer, the term of this patent is extended or adjusted under 35 U.S.C. 154(b) by 447 days.

(21) Appl. No.: 17/615,936

(22) PCT Filed: Jan. 27, 2021

(86) PCT No.: PCT/CN2021/073906
§ 371 (c)(1),
(2) Date: Dec. 2, 2021

(87) PCT Pub. No.: WO2021/179823
PCT Pub. Date: Sep. 16, 2021

(65) Prior Publication Data
US 2022/0319955 A1 Oct. 6, 2022

(30) Foreign Application Priority Data

Mar. 12, 2020 (CN) .......................... 202020303368.6

(51) Int. Cl.
*H01L 23/38* (2006.01)
(52) U.S. Cl.
CPC .................................... *H01L 23/38* (2013.01)
(58) Field of Classification Search
None
See application file for complete search history.

(56) References Cited

U.S. PATENT DOCUMENTS 5,367,879 A * 11/1994 Doke ...................... F25B 21/02
62/3.6
2009/0294117 A1* 12/2009 Hodes ................... H01L 23/427
165/104.34

(Continued)

FOREIGN PATENT DOCUMENTS

CN 201360012 Y 12/2009
CN 101673780 A 3/2010

(Continued)

OTHER PUBLICATIONS

International Search Report mailed Apr. 30, 2021 in related application No. PCT/CN2021/073906.

*Primary Examiner* — Brent A. Fairbanks
*Assistant Examiner* — Derek L Nielsen
(74) *Attorney, Agent, or Firm* — Renner, Kenner, Greive, Bobak, Taylor & Weber

(57) ABSTRACT

The present invention discloses a thermal thick film integrated circuit comprising: a metal substrate and a vapor chamber which arranged in layers, and a thermoelectric element sandwiched between the metal substrate and the vapor chamber, wherein an integrated circuit is arranged on a surface of the metal substrate proximal to the vapor chamber, and the thermoelectric element is connected to a power supply. The thermal thick film integrated circuit has fewer parts, is simpler and more reliable. The thermal thick film integrated circuit adopts an integrated and compact design, which occupies a small space, has high in reliability, and is safe due to fewer use of wires. For large surface area, the temperature is evenly and quickly distributed during cooling, and it has high heat dissipation performance, high efficiency, convenience and easy to develop and use.

14 Claims, 4 Drawing Sheets

(56) References Cited

U.S. PATENT DOCUMENTS

| | | | | |
|---|---|---|---|---|
| 2011/0072834 A1* | 3/2011 | Ishikura | ............... | G05D 23/192 |
| | | | | 62/3.2 |
| 2013/0168379 A1 | 7/2013 | Deenan | | |
| 2015/0233592 A1* | 8/2015 | Giraud | ................... | F25B 21/02 |
| | | | | 62/3.7 |
| 2017/0328648 A1* | 11/2017 | Dede | .................. | F28D 15/0233 |
| 2018/0351069 A1* | 12/2018 | Boukai | .................. | H10N 10/13 |

FOREIGN PATENT DOCUMENTS

| | | |
|---|---|---|
| CN | 202216380 U | 5/2012 |
| CN | 203136203 U | 8/2013 |
| CN | 104467536 A | 3/2015 |
| CN | 106348754 A | 1/2018 |
| CN | 208253848 U | 12/2018 |
| JP | H02238232 A | 9/1990 |
| KR | 200600018181 A | 2/2006 |

\* cited by examiner

THERMAL THICK FILM INTEGRATED CIRCUIT

CROSS-REFERENCE TO RELATED APPLICATION

The present application is a national phase application of PCT/CN2021/073906 filed on 27 Jan. 2021, which claims priority to China utility model application No. 202020303368.6 filed on 12 Mar. 2020, both of which are incorporated herein by reference in their entirety.

TECHNICAL FIELD OF THE INVENTION

The present invention relates to the technical field of electronic devices, and in particular the present invention relates to a thick-film integrated circuit with cooling and heating functions.

BACKGROUND

Existing cooling and heating devices are made of multiple components, are complex in structure and bulky in size; and adopt non-integrated and non-compact design which take up a lot of space and associate with low reliability. Further, if the device has a slightly larger surface area, temperature distribution is unevenly distributed during cooling, which leads to poor heat dissipation performance and low efficiency. At the same time, conventional device is inconvenient and difficult to develop and manufacture, especially difficult to manufacture by automation technology, leading to high manufacturing costs.

SUMMARY

The objective of the present invention is to provide a thermal thick film integrated circuit to overcome the deficiency in the traditional bulky and structurally complicated cooling and heating devices.

The present invention provides the following technical solutions to solve above-mentioned technical problems: a thermal thick film integrated circuit comprises a metal substrate and a vapor chamber arranged in layers, and a thermoelectric element sandwiched between the metal substrate and the vapor chamber, wherein a surface of the metal substrate proximal to the vapor chamber comprises an integrated circuit and the thermoelectric element is connected to a power supply.

Edge portions of the metal substrate and the vapor chamber is sealed with a sealant.

The present invention further comprises a sensor for detecting real-time temperature of the metal substrate. The sensor is positioned on the surface of the metal substrate proximal to the vapor chamber. The sensor is connected to interior and exterior surface of the integrated circuit. The sensor includes signaling probe connected to these external elements.

The thermal thick film integrated circuit further comprise a thermal fuse on the metal substrate. The thermal fuse is connected to circuit traces on the metal substrate.

The metal substrate is a metal substrate with high thermal conductivity; and/or the thermoelectric element is a thermoelectric cooler.

The thermal thick film integrated circuit further comprises a microcontroller connected to the interior and exterior surface of the integrated circuit; the microcontroller is similarly connected to an element on the metal substrate.

The metal substrate may work as the negative electrode of the circuit; and an ultrasonic transducer may be integrated on the metal substrate.

The metal substrate of the thermal thick film integrated circuit, the metal substrate may be integrated with a metal thermostat formed by two pieces of metal having different thermal expansion coefficients.

Outer surface of the metal substrate and/or the vapor chamber may be provided with a protective coating or a waterproof condensation coating; and/or the metal substrate may be provided with an antenna.

The thermoelectric element is in a form of a sheet; alternatively, the thermoelectric element is pellet directly deposited on the metal substrate to form a thick film.

The present invention provides a thermal thick film integrated circuit, comprising: a metal substrate and a vapor chamber which are arranged in layers, and a thermoelectric element sandwiched between the metal substrate and the vapor chamber, wherein an integrated circuit is positioned on a surface of the metal substrate proximal to the vapor chamber, and the thermoelectric element is connected to a power supply. Compared with the existing technology, the present invention has the following advantages:

1. The thermal thick film integrated circuit has fewer parts and is simpler and more reliable.
2. The thermal thick film integrated circuit adopts an integrated and compact design, which occupies a small space, is high in reliability, and is safe due to fewer use of wires.
3. Temperature is evenly and quickly distributed for cooling a large surface area.
4. The thermal thick film integrated circuit is associated with high heat dissipation performance and high efficiency.
5. The thermal thick film integrated circuit is easy to use and develop.
6. The thermal thick film integrated circuit may be integrated with a micro-controller (single chip microcomputer) to form a programmable thick-film integrated cooling and heating circuit.
7. The thermal thick film integrated circuit is easy to manufacture, especially by automation technology to reduce manufacturing costs.
8. The thermal thick film integrated circuit may be integrated with an antenna and a sensor; and may be remotely communicated for use in IoT systems.
9. The thermal thick film integrated circuit may be integrated with a battery; and it is responsive and has low thermal inertia.

DETAILED DESCRIPTION

To facilitate understanding of the objectives, technical schemes and advantages of the present invention, the present invention will be further described in detail with reference to the drawings and embodiments. It should be understood that the specific embodiments described here are only used to explain the present invention, and are not used to limit the present invention.

Figure 1:
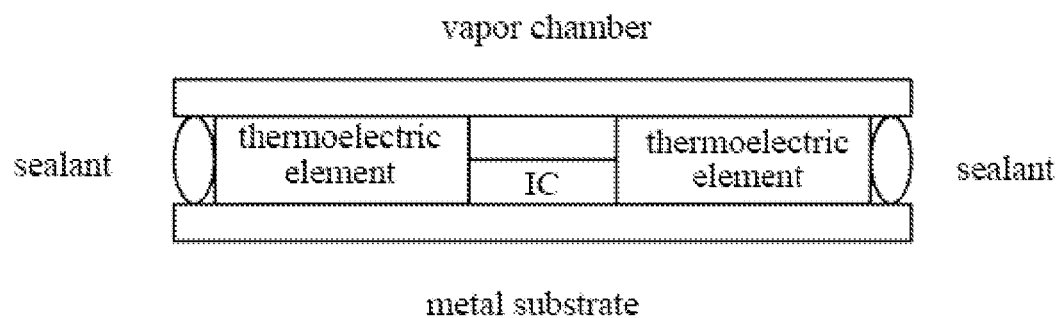
FIG. 1 is a schematic structural diagram of a thermal thick film integrated circuit according to a first embodiment of the present invention.
Figure 2:
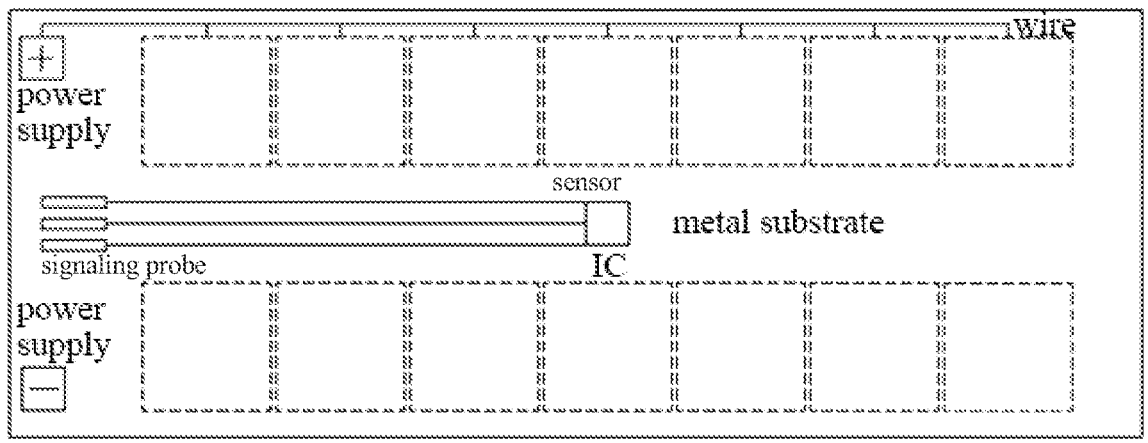
FIG. 2 is a top elevated view of a metal substrate of the thermal thick film integrated circuit shown in FIG. 1 depicting arrangement of thermoelectric elements, an integrated circuit and a sensor.
Figure 3:
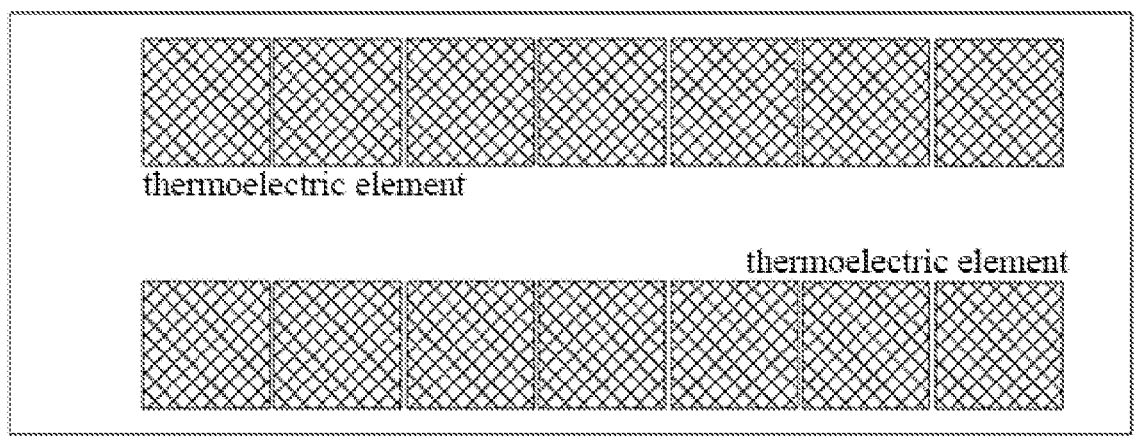
FIG. 3 is a schematic diagram showing the arrangement of thermoelectric elements of the thermal thick film integrated circuit shown in FIG. 1.
Figure 4:
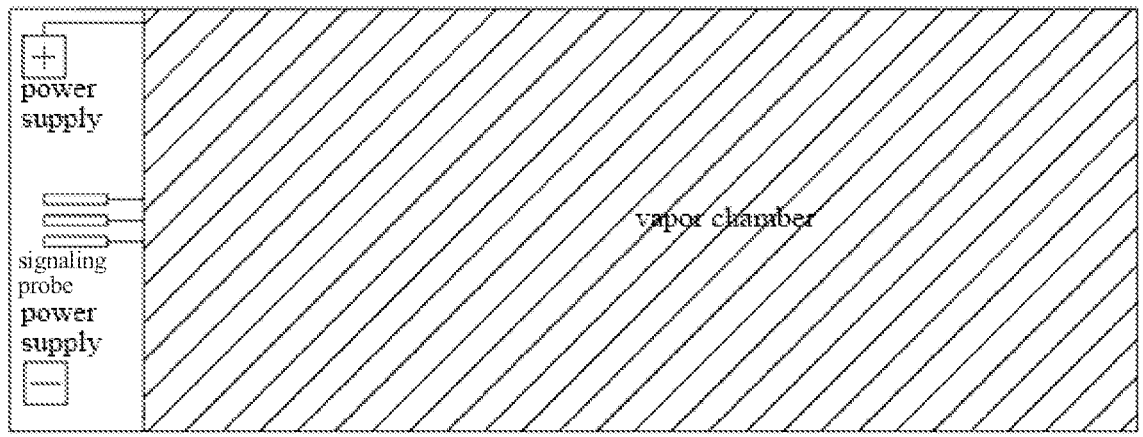
FIG. 4 is a schematic structural diagram of a vapor chamber of the thermal thick film integrated circuit shown in FIG. 1.
Figure 5:
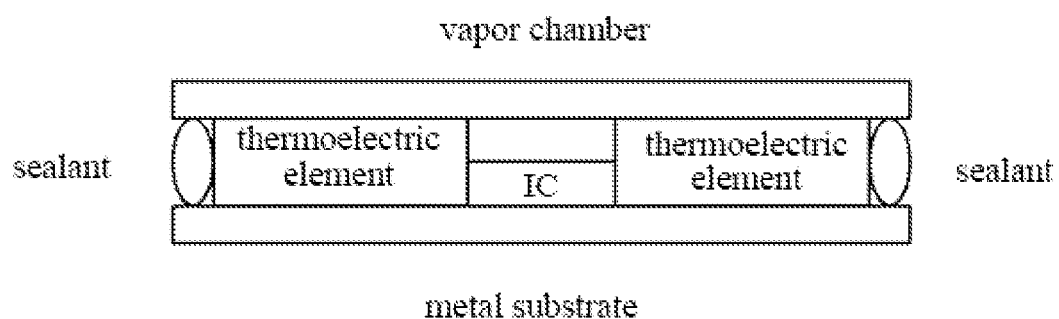
FIG. 5 is a schematic structural diagram of the thermal thick film integrated circuit according to a second embodiment of the present invention.
Figure 6:
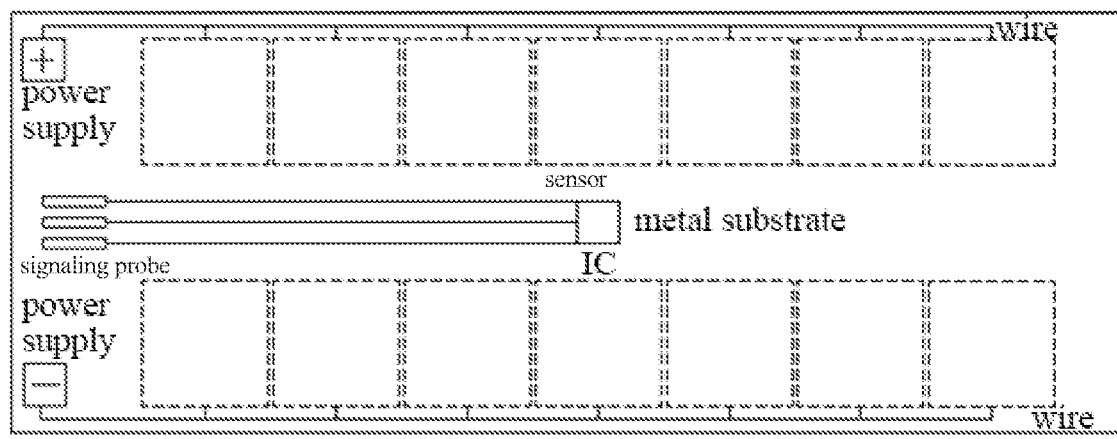
FIG. 6 is a top elevated view of an aluminum substrate of the thermal thick film integrated circuit shown in FIG. 5, on which thermoelectric elements, an integrated circuit and sensors are arranged.
Figure 7:
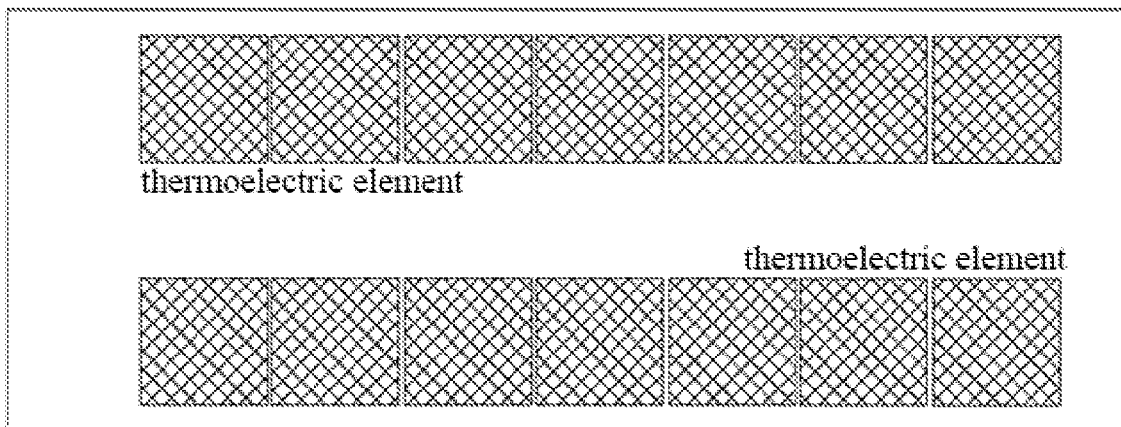
FIG. 7 is a schematic diagram of the arrangement of coolers of the thermal thick film integrated circuit shown in FIG. 5.
Figure 8:
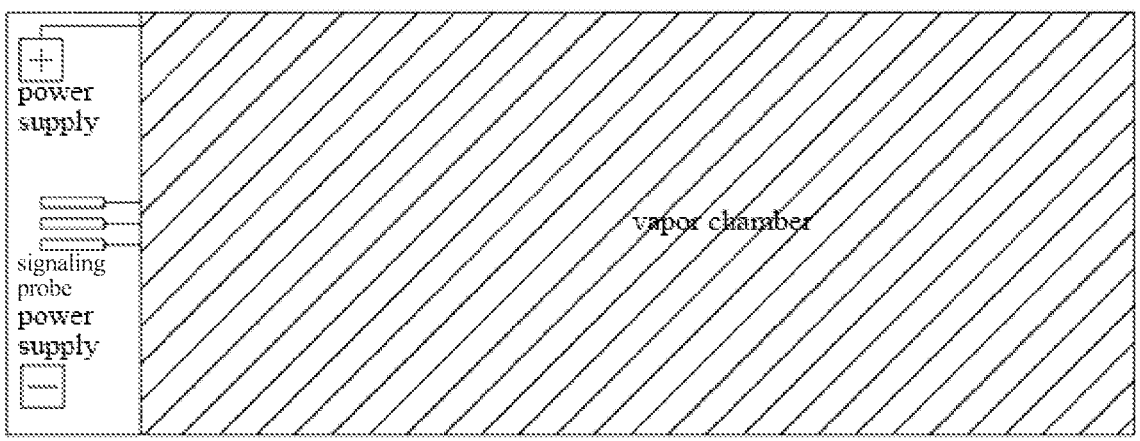
FIG. 8 is a schematic structural diagram of a vapor chamber of the thermal thick film integrated circuit shown in FIG. 5.
Figure 9:
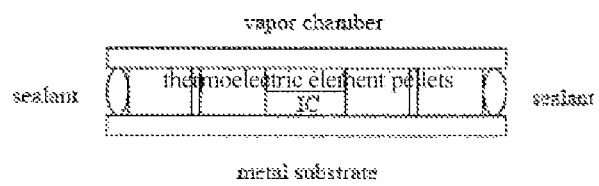
FIG. 9 is a schematic structural diagram of the thermal thick film integrated circuit according to a third embodiment of the present invention.
Figure 10:
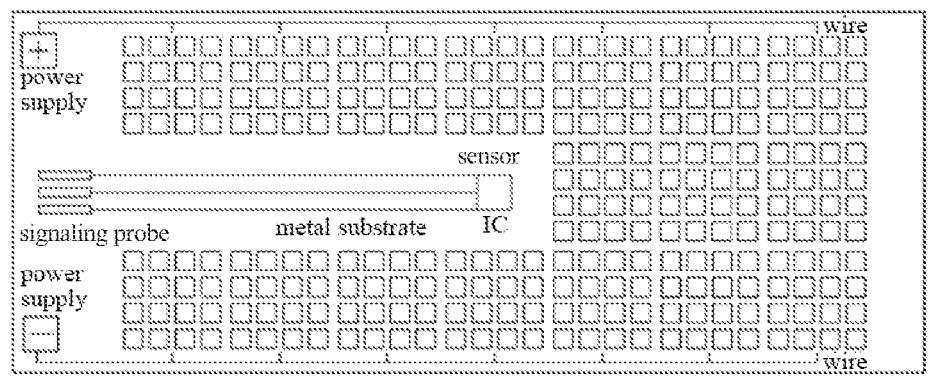
FIG. 10 is a top elevated view of a metal substrate of the thermal thick film integrated circuit shown in FIG. 9 depicting the arrangement of thermoelectric elements as pellets, an integrated circuit and a sensor.
Figure 11:
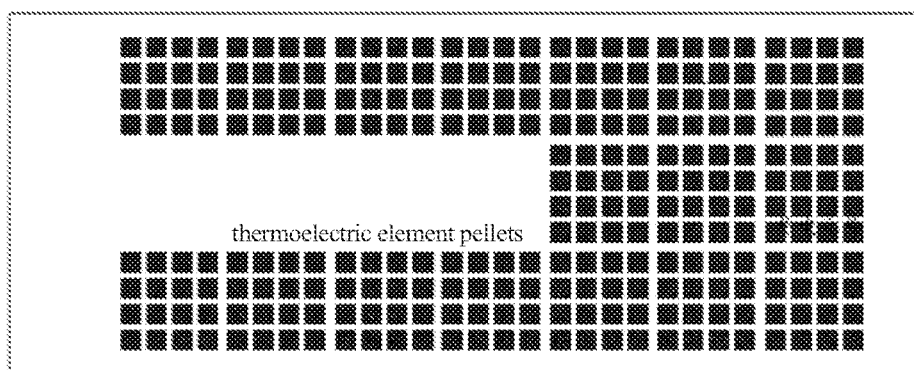
FIG. 11 is a schematic diagram of the arrangement of thermoelectric pellets of the thermal thick film integrated circuit shown in FIG. 9.
Figure 12:
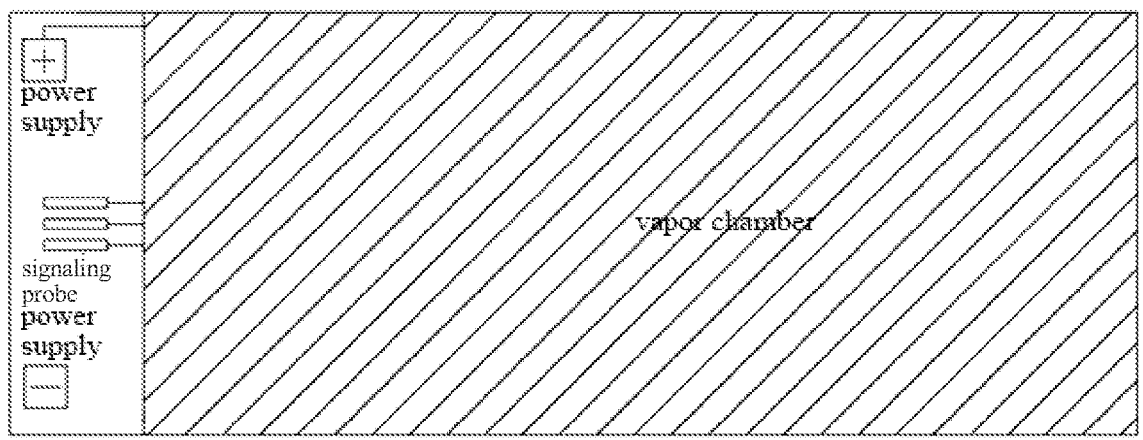
FIG. 12 is a schematic structural diagram of a vapor chamber of the thermal thick film integrated circuit shown in FIG. 9.

Referring to FIG. 1-FIG. 4, FIG. 1 is a schematic structural diagram of a thermal thick film integrated circuit according to a first embodiment of the present invention; FIG. 2 is a top elevated view of a metal substrate of the thermal thick film integrated circuit shown in FIG. 1 depicting thermoelectric elements, an integrated circuit and a sensor may be arranged; FIG. 3 is a schematic diagram of the arrangement of thermoelectric elements of the thermal thick film integrated circuit shown in FIG. 1; and FIG. 4 is a schematic structural diagram of a vapor chamber of the thermal thick film integrated circuit shown in FIG. 1.

The present invention provides a thermal thick film integrated circuit comprising: a metal substrate and a vapor chamber which are arranged in layers, and thermoelectric element sandwiched between the metal substrate and the vapor chamber. An integrated circuit is positioned on a surface of the metal substrate proximal to the vapor chamber, and the thermoelectric element is connected to a power supply.

The present invention comprises a bottom layer of the metal substrate as a main structure, and an integrated circuit in the middle. The power supply is connected to the thermoelectric element through a planar circuit traces on the metal substrate for cooling or heating as required.

A middle layer is composed of thermoelectric elements arranged neatly and efficiently.

Upper layer is the vapor chamber to provide heat dissipation for the thermoelectric elements.

During cooling, the metal substrate forms a cold freezing surface from the freezing function of the thermoelectric elements, and the vapor chamber absorbs the heat generated by thermoelectric elements and enhances the heat dissipation effect.

On the contrary, in case of heating, the metal substrate heats up, and the other surface of the thermoelectric elements become cold. At the same time, the vapor chamber becomes cold and absorbs heat from the surrounding environment.

In one embodiment of the present invention as described above, the thermal thick film integrated circuit has fewer parts, is simpler and more reliable. The thermal thick film integrated circuit adopts an integrated and compact design, which occupies a small space, is high in reliability, and is safe due to fewer use of wires. Temperature can be evenly and quickly distributed when cooling a large surface area, and it has high heat dissipation performance, high efficiency, convenience and easy to develop and use.

In one embodiment, the power supply may be a battery or an external power supply, and the battery may be internally integrated or externally provided.

A sealant is provided to edge portions of the metal substrate and the vapor chamber for sealing. Vacuum may be applied during packaging to prevent water from condensing during use due to the presence of air inside.

In another embodiment, a sensor for detecting real-time temperature of the metal substrate is also positioned on the surface of the metal substrate proximal to the vapor chamber. The sensor is connected to an interior and exterior surface of the integrated circuit and is provided with signal probe for connecting interior and exterior surfaces. By providing the sensor, the temperature can be prevented from getting too high or too low, so that the thermal thick film integrated circuit and the user are not harmed. In addition, the detected temperature can be transmitted to other integrated circuits for temperature regulation.

Further, the thermal thick film integrated circuit further comprises a thermal fuse on the metal substrate. The thermal fuse is connected to circuit traces on the metal substrate.

By providing a thermal fuse for overcurrent, power is cut off in the case of overheating, the power supply is also cut off due to excess voltage to prevent overloading, short circuit or electric shock from happening. The thermal fuse may be connected to an overvoltage protection diode.

Further, the metal substrate may work as the negative electrode of the circuit, so that the overall circuit trace is simpler, and therefore the negative electrode of the power supply can be connected to the metal substrate.

In addition, an ultrasonic transducer may be integrated on the metal substrate for other functional purposes.

In addition, a low-cost thermostat made of two pieces of different metals may be integrated on the thermal thick film integrated circuit.

Further, the metal substrate may also be used as an electrode for other functional purposes.

Further, outer surface of the metal substrate and/or the vapor chamber is provided with a protective coating. The protective coating may be a moisture-proof, water-proof and scratch-proof coating.

In addition, the metal substrate may also be provided with an antenna to form an IoT system.

Further, the thermal thick film integrated circuit further comprises a microcontroller, said microcontroller is connected to the interior or exterior of the integrated circuit. With the microcontroller, the thermal thick film integrated circuit becomes a programmable thermal thick film integrated circuit.

In this embodiment, the thermoelectric elements are in the form of a sheet and are arranged neatly on the metal substrate.

In other embodiments, as shown in FIGS. 5-8, the metal substrate may be an aluminum substrate; and the thermoelectric elements may be thermoelectric coolers.

In other embodiments, as shown in FIGS. 9-12, the thermoelectric elements are pellets directly deposited on the metal substrate to form a thick film, that is, the pellets as the thermoelectric elements may be directly deposited on the metal substrate to form a thermal thick film integrated circuit.

The thermal thick film integrated circuit of the present invention addresses the defects of bulkiness and complex structures in traditional cooling and heating devices. The thermal thick film integrated circuit may be portable, and are not limited to be applied in: air conditioning, as portable belongings, electronic parts and devices thereof, used in medicine and beauty, science and technology, machinery and robots, thermostat, pets and therapeutic medical research for pets, biological research, medicines, aquariums, national defense and weapons, aerospace and space, water and underwater.

The present invention provides a thermal thick film integrated circuit, comprising: a metal substrate and a vapor chamber which are arranged in layers, and thermoelectric elements sandwiched between the metal substrate and the vapor chamber, where an integrated circuit is positioned on a surface of the metal substrate proximal to the vapor chamber, and the thermoelectric element is connected to a power supply. Compared with the existing technology, the present invention has the following specific advantages:

1. The thermal thick film integrated circuit has fewer parts and is simpler and more reliable.

2. The thermal thick film integrated circuit adopts an integrated and compact design, which occupies a small space, has high reliability, and is safe due to fewer use of wires.

3. Temperature is evenly and quickly distributed during cooling for large surface area.

4. The thermal thick film integrated circuit is associated with high heat dissipation performance, high efficiency and high effectiveness.

5. The thermal thick film integrated circuit is convenient and easy to develop and use.

6. The thermal thick film integrated circuit may be integrated with a micro-controller (single chip microcomputer) to form a programmable thermal thick film integrated circuit.

7. The thermal thick film integrated circuit is easily manufactured, especially by automation technology to reduce manufacturing costs.

8. The thermal thick film integrated circuit may be integrated with an antenna and a sensor; and may be remotely communicated for used in IoT system.

9. The thermal thick film integrated circuit may be integrated with a battery; and it is responsive and has low thermal inertia.

The above only describes some preferred specific embodiments of the present invention, but the protection scope of the present invention is not limited thereto. Any changes or replacements that can be easily conceived by those skilled in the art within the technical scope disclosed by the present invention should be covered by the protection scope of the present invention. Therefore, the protection scope of the present invention should be subject to the protection scope of the claims.

The invention claimed is:

1. A thermal thick film integrated circuit comprising: a metal substrate and a vapor chamber which are arranged in layers, and one or more thermoelectric element sandwiched between the metal substrate and the vapor chamber, wherein a first surface of the one or more thermoelectric elements is in contact with the metal substrate and wherein a second surface of the one or more thermoelectric elements is in contact with the vapor chamber, wherein an integrated circuit is arranged on a surface of the metal substrate proximal to the vapor chamber, such that the integrated circuit is in between the metal substrate and the vapor chamber, and the one or more thermoelectric element being connected to a power supply.

2. The thermal thick film integrated circuit of claim 1, wherein edge portions of the metal substrate and the vapor chamber are sealed with a sealant.

3. The thermal thick film integrated circuit of claim 1, wherein a sensor for detecting real-time temperature of the metal substrate is positioned on a surface of the metal substrate such that the sensor is in between the metal substrate and the vapor chamber, and the sensor is connected to an interior or exterior surface of the integrated circuit, and is provided with one or more signal probe being connected to these external elements.

4. The thermal thick film integrated circuit of claim 1, further comprising a thermal fuse on the metal substrate, wherein the thermal fuse is connected to circuit traces on the metal substrate.

5. The thermal thick film integrated circuit of claim 1, wherein the metal substrate is a metal substrate with high thermal conductivity.

6. The thermal thick film integrated circuit of claim 1, further comprising a microcontroller connected to an element on the metal substrate.

7. The thermal thick film integrated circuit of claim 1, wherein the metal substrate is the negative electrode of the circuit; and an ultrasonic transducer is integrated on the metal substrate.

8. The thermal thick film integrated circuit of claim 1, wherein a metal thermostat made of two pieces of metals having different thermal expansion coefficients is integrated on the metal substrate.

9. The thermal thick film integrated circuit of claim 1, wherein an outer surface of the metal substrate and/or the vapor chamber is provided with a protective coating or a waterproof condensation coating and/or the metal substrate is provided with an antenna.

10. The thermal thick film integrated circuit of claim 1, the one or more thermoelectric element being in the form of a sheet.

11. The thermal thick film integrated circuit of claim 1, wherein a width of the metal substrate and a width of the vapor chamber are similar.

12. The thermal thick film integrated circuit of claim 1, the one or more thermoelectric element being pellets directly deposited on the metal substrate.

13. The thermal thick film integrated circuit of claim 1, the one or more thermoelectric element being capable of both cooling and heating.

14. The thermal thick film integrated circuit of claim 1, wherein the metal substrate does not include a vapor chamber.

* * * * *